（12） United States Patent
Yang

(10) Patent No.: US 12,278,138 B2
(45) Date of Patent: Apr. 15, 2025

(54) METHOD OF MANUFACTURING MEMORY DEVICE WITH FIRST AND SECOND ISOLATION MEMBERS USING PATTERNED PHOTORESIST LAYER AND ENERGY-DECOMPOSABLE MASK

(71) Applicant: NANYA TECHNOLOGY CORPORATION, New Taipei (TW)

(72) Inventor: Cheng-Ling Yang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 544 days.

(21) Appl. No.: 17/737,722

(22) Filed: May 5, 2022

(65) Prior Publication Data

US 2023/0360959 A1   Nov. 9, 2023

(51) Int. Cl.
*H01L 21/762* (2006.01)
*H01L 21/308* (2006.01)
*H10B 20/25* (2023.01)

(52) U.S. Cl.
CPC .... *H01L 21/76224* (2013.01); *H01L 21/3081* (2013.01); *H01L 21/3085* (2013.01); *H01L 21/3086* (2013.01); *H10B 20/25* (2023.02)

(58) Field of Classification Search
CPC ........... H01L 21/76244; H01L 27/0924; H01L 21/3085; H01L 21/3081; H01L 21/3086; H01L 29/0649; H10B 20/25
See application file for complete search history.

(56) References Cited

U.S. PATENT DOCUMENTS

2018/0019170 A1   1/2018  Glass et al.
2018/0197789 A1   7/2018  Glass et al.
(Continued)

FOREIGN PATENT DOCUMENTS

TW   202212970 A   4/2022
TW   202216906 A   5/2022

OTHER PUBLICATIONS

Office Action and the search report mailed on Jul. 31, 2024 related to U.S. Appl. No. 17/737,703.
(Continued)

*Primary Examiner* — Alia Sabur
*Assistant Examiner* — Emily Nicole Farmer
(74) *Attorney, Agent, or Firm* — Xuan Zhang

(57) ABSTRACT

The present application provides a method of manufacturing a memory device. The method includes steps of providing a semiconductor substrate including an active area disposed over or in the semiconductor substrate; disposing a patterned photoresist layer over the semiconductor substrate; removing a first portion of the semiconductor substrate exposed through the patterned photoresist layer to form a first trench; removing the patterned photoresist layer; forming a first isolation member within the first trench; disposing an energy-decomposable mask over the semiconductor substrate and the first isolation member; irradiating a portion of the energy-decomposable mask with an electromagnetic radiation; removing the portion of the energy-decomposable mask irradiated with the electromagnetic radiation to form a patterned energy-decomposable mask; removing a second portion of the semiconductor substrate exposed through the patterned energy-decomposable mask to form a second trench; removing the patterned energy-decomposable mask; and forming a second isolation member within the second trench.

14 Claims, 28 Drawing Sheets

(56) References Cited

U.S. PATENT DOCUMENTS

2019/0181222 A1* 6/2019 Liao ................... H01L 29/0642
2020/0027981 A1  1/2020 Park et al.
2020/0073243 A1  3/2020 Ho et al.
2020/0343253 A1  10/2020 Lin
2021/0320110 A1  10/2021 Chern
2021/0389670 A1* 12/2021 Chen ................... C09D 201/02
2022/0285203 A1* 9/2022 Chiu ................... H01L 21/3083

OTHER PUBLICATIONS

Office Action and the search report mailed on Oct. 8, 2024 related to U.S. Appl. No. 17/373,703.
Office Action mailed on Aug. 30, 2023 related to Taiwanese Application No. 111123486.
Office Action mailed on Aug. 30, 2023 related to Taiwanese Application No. 111123489.

* cited by examiner

METHOD OF MANUFACTURING MEMORY DEVICE WITH FIRST AND SECOND ISOLATION MEMBERS USING PATTERNED PHOTORESIST LAYER AND ENERGY-DECOMPOSABLE MASK

TECHNICAL FIELD

The present disclosure relates to a memory device and a manufacturing method thereof, and more particularly, to a memory device including an active area (AA) in a shape of an elongated block and a manufacturing method of the memory device.

DISCUSSION OF THE BACKGROUND

Nonvolatile memory devices can retain data even when their power supply is cut off. One type of nonvolatile memory device is a one-time-programmable (OTP) memory device. With the OTP memory device, a user can program the OTP memory device only once, and data stored in the OTP memory device cannot be modified. A signal is transmitted to a metallic interconnect disposed above a semiconductive substrate.

However, such routing of the metallic interconnect presents an obstacle to increasing routing density of the memory device. Such routing may induce a narrower process window and may result in misalignment or leakage among the memory cells in the memory device, and therefore limits reduction of minimum feature size. It is therefore desirable to develop improvements that address related manufacturing challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of manufacturing a memory device. The method includes steps of providing a semiconductor substrate including an active area disposed over or in the semiconductor substrate, and a patterned photoresist layer over the semiconductor substrate; removing a first portion of the semiconductor substrate exposed through the patterned photoresist layer to form a first trench; removing the patterned photoresist layer; forming a first isolation member within the first trench; disposing an energy-decomposable mask over the semiconductor substrate and the first isolation member; irradiating a portion of the energy-decomposable mask with an electromagnetic radiation; removing the portion of the energy-decomposable mask irradiated with the electromagnetic radiation to form a patterned energy-decomposable mask; removing a second portion of the semiconductor substrate exposed through the patterned energy-decomposable mask to form a second trench; removing the patterned energy-decomposable mask; and forming a second isolation member within the second trench.

In some embodiments, the disposing of the energy-decomposable mask is performed after the formation of the first isolation member.

In some embodiments, the energy-decomposable mask is thermally decomposable, photonically decomposable or electron-beam (e-beam) decomposable.

In some embodiments, the energy-decomposable mask includes a cross-linking compound having a functional group or a double bonding.

In some embodiments, the energy-decomposable mask includes polymer, polyimide, resin or epoxy.

In some embodiments, the electromagnetic radiation is emitted vertically toward the portion of the energy-decomposable mask.

In some embodiments, the electromagnetic radiation is infrared (IR), ultraviolet (UV) or electron beam (e-beam).

In some embodiments, the first isolation member and the second isolation member surround the active area of the semiconductor substrate.

In some embodiments, the first isolation member and the second isolation member include a same material.

In some embodiments, the first isolation member is integral with the second isolation member to form a shallow trench isolation (STI).

In some embodiments, the formation of the first trench is performed prior to the formation of the second trench.

In some embodiments, the first isolation member is formed by disposing a first isolation material over the semiconductor substrate and within the first trench.

In some embodiments, the second isolation member is formed by disposing a second isolation material over the semiconductor substrate and within the second trench.

In some embodiments, the patterned photoresist layer and the patterned energy-decomposable mask include different materials.

Another aspect of the present disclosure provides a method of manufacturing a memory device. The method includes steps of providing a semiconductor substrate having an active area disposed over or in the semiconductor substrate, and a first isolation member extending into the semiconductor substrate and disposed adjacent to the active area; disposing an energy-decomposable mask over the semiconductor substrate and the first isolation member; irradiating a portion of the energy-decomposable mask with an electromagnetic radiation; removing the portion of the energy-decomposable mask irradiated with the electromagnetic radiation to form a patterned energy-decomposable mask; removing a portion of the semiconductor substrate exposed through the patterned energy-decomposable mask to form a trench; removing the patterned energy-decomposable mask; and forming a second isolation member within the trench.

In some embodiments, the first isolation member is covered by the energy-decomposable mask.

In some embodiments, a length of the first isolation member is substantially greater than a length of the second isolation member.

In some embodiments, a depth of the first isolation member is substantially equal to a depth of the second isolation member.

In some embodiments, the first isolation member is covered by the patterned energy-decomposable mask.

In some embodiments, the portion of the energy-decomposable mask is removed by etching.

In some embodiments, the first isolation member and the second isolation member include oxide.

In some embodiments, the active area of the semiconductor substrate is surrounded by the first isolation member and the second isolation member.

In some embodiments, the electromagnetic radiation is disposed over the energy-decomposable mask.

In some embodiments, a depth of the trench is substantially equal to a depth of the first isolation member.

Another aspect of the present disclosure provides a method of manufacturing a memory device. The method includes steps of providing a semiconductor substrate having an active area disposed over or in the semiconductor substrate; disposing an energy-decomposable mask over the semiconductor substrate; treating a portion of the energy-decomposable mask; removing the portion of the energy-decomposable mask to form a patterned energy-decomposable mask; removing a portion of the semiconductor substrate exposed through the patterned energy-decomposable mask to form a trench; removing the patterned energy-decomposable mask; and forming an isolation member within the trench.

In some embodiments, the active area is disposed adjacent to the trench.

In some embodiments, the portion of the energy-decomposable mask is treated with an electromagnetic radiation.

In some embodiments, the electromagnetic radiation is infrared (IR), ultraviolet (UV) or electron beam (e-beam).

In some embodiments, the electromagnetic radiation is emitted above the energy-decomposable mask.

In some embodiments, the isolation member includes oxide.

In some embodiments, the energy-decomposable mask is disposed by chemical vapor deposition (CVD) or physical vapor deposition (PVD).

In some embodiments, the isolation member is formed by oxidation.

In some embodiments, the isolation member is formed by disposing an isolation material over the semiconductor substrate and within the trench.

In some embodiments, the isolation material above the trench is removed.

In some embodiments, the semiconductor substrate includes silicon.

In conclusion, because the active area of the semiconductor substrate is defined by disposing a patterned energy-decomposable mask over the semiconductor substrate and then removing predetermined portions of the semiconductor substrate exposed through the patterned energy-decomposable mask, a size of the active area can be maintained with minimal or no decrease during the removal. Therefore, a process window for subsequent processes over the active area is not further reduced. As a result, misalignment or leakage among the memory cells in the memory device can be prevented or minimized, and an overall performance the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
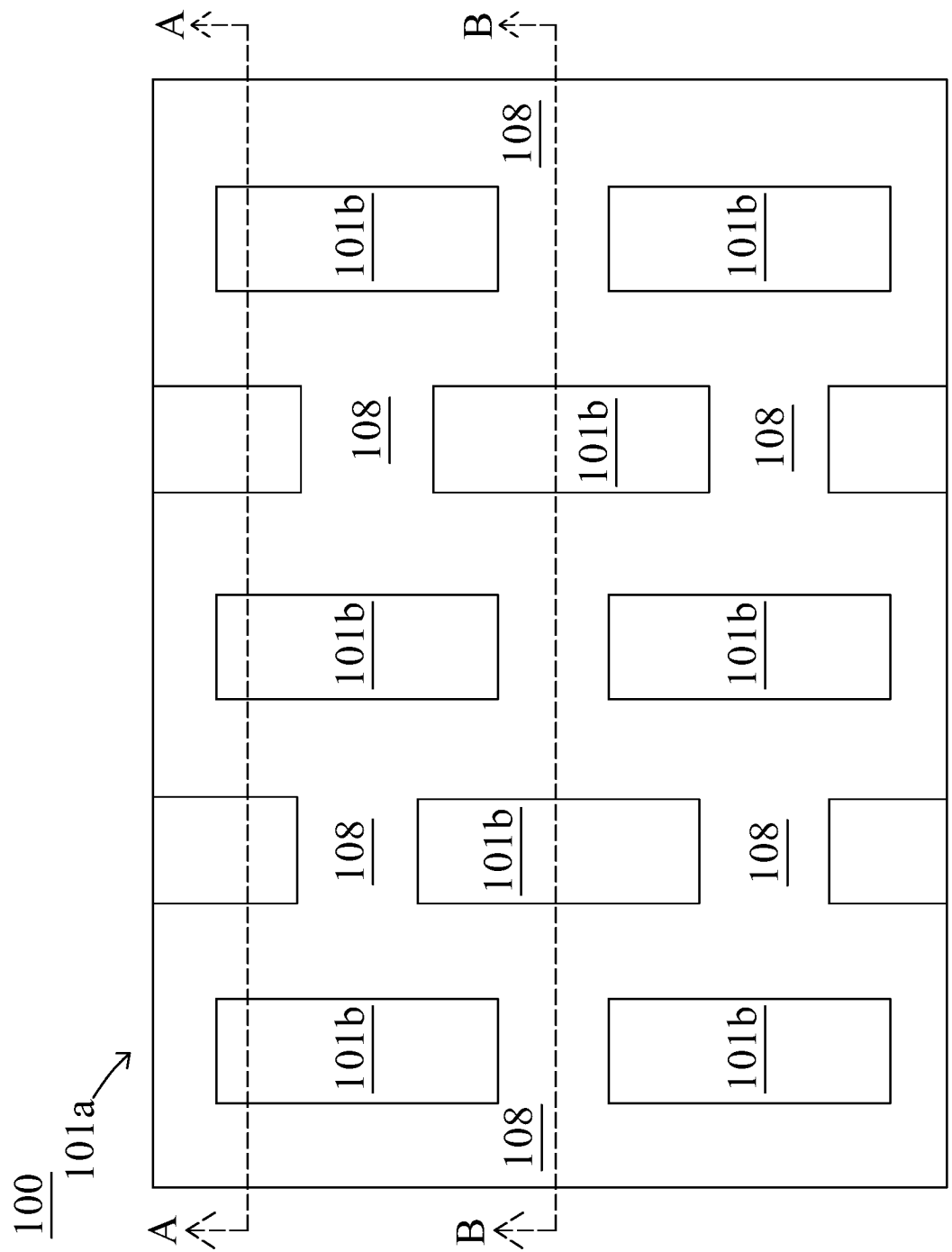
FIG. 1 is a cross-sectional top view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
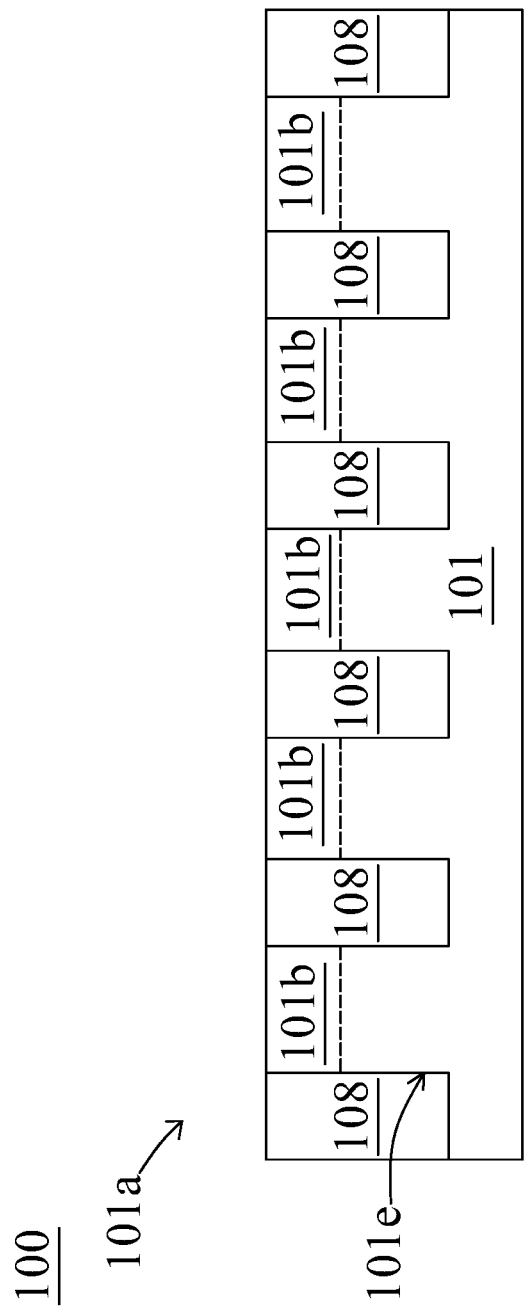
FIG. 2 is a cross-sectional side view of the memory device along a line A-A in FIG. 1.
Figure 3:
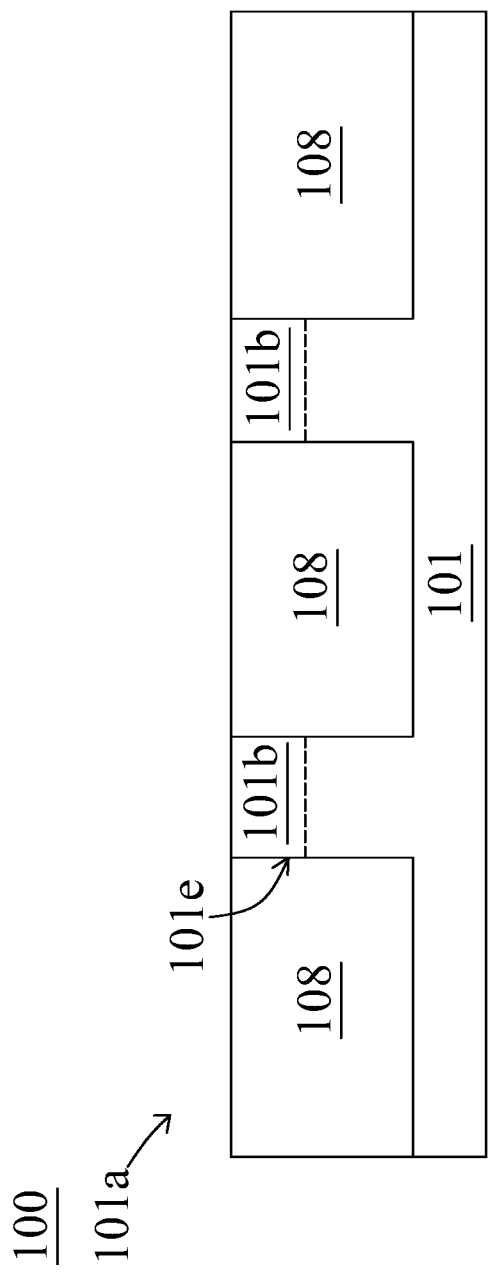
FIG. 3 is a cross-sectional side view of the memory device along a line B-B in FIG. 1.

FIG. 1 is a schematic cross-sectional top view of a memory device 100 in accordance with some embodiments of the present disclosure. FIG. 2 is a schematic cross-sectional side view of the memory device 100 along a line A-A in FIG. 1. FIG. 3 is a schematic cross-sectional side view of the memory device 100 along a line B-B in FIG. 1. In some embodiments, the memory device 100 as shown in FIG. 1 can be a part of device. In some embodiments, the memory device 100 includes several unit cells arranged along rows and columns.

In some embodiments, the memory device 100 includes a semiconductor substrate 101. In some embodiments, the semiconductor substrate 101 is semiconductive in nature. In some embodiments, the semiconductor substrate 101 is a semiconductor wafer (e.g., a silicon wafer) or a semiconductor-on-insulator (SOI) wafer (e.g., a silicon-on-insulator wafer). In some embodiments, the semiconductor substrate 101 is a silicon substrate.

In some embodiments, the semiconductor substrate 101 is defined with a peripheral region (not shown) and an array region 101a. In some embodiments, the array region 101a is at least partially surrounded by the peripheral region. In some embodiments, the peripheral region is adjacent to a periphery of the semiconductor substrate 101, and the array region 101a is adjacent to a central area of the semiconductor substrate 101. In some embodiments, the array region 101a may be used for fabricating electronic components such as capacitors, transistors or the like. In some embodiments, a boundary is disposed between the peripheral region and the array region 101a.

In some embodiments, the semiconductor substrate 101 includes an active area 101b disposed over or in the semiconductor substrate 101. In some embodiments, the active area 101b is a doped region in the semiconductor substrate 101. In some embodiments, the active area 101b extends horizontally over or under a top surface of the semiconductor substrate 101. In some embodiments, a dimension of a top cross section of each active area 101b can be same as or different from those of other active areas 101b. In some embodiments, the active area 101b is in a strip, elongated, rectangular or polygonal shape.

In some embodiments, each of the active areas 101b includes a same type of dopant. In some embodiments, each of the active areas 101b includes a type of dopant that is different from the types of dopants included in other active areas 101b. In some embodiments, each of the active areas 101b has a same conductive type. In some embodiments, the active area 101b includes N-type dopants.

In some embodiments, the semiconductor substrate 101 includes a recess 101e extending into the semiconductor substrate 101 and surrounding the active area 101b. In some embodiments, the recess 101e is surrounded by one or more active areas 101b. The recess 101e extends away from the active area 101b and toward the semiconductor substrate 101.

In some embodiments, the memory device 100 includes an isolation member 108 surrounding the active area 101b of the semiconductor substrate 101. In some embodiments, the active area 101b is surrounded by the isolation member 108, such that the active areas 101b are separated and electrically isolated from each other by the isolation member 108. In some embodiments, the active areas 101b are arranged along a column or row direction. In some embodiments, the active area 101b is entirely surrounded by the isolation member 108.

In some embodiments, the isolation member 108 is a shallow trench isolation (STI) or is a part of the STI. In some embodiments, the isolation member 108 defines a boundary of the active area 101b. In some embodiments, the isolation member 108 is formed of an insulating material, such as silicon oxide, silicon nitride, silicon oxynitride, the like or a combination thereof.

In some embodiments, the isolation member 108 is at least partially disposed within the recess 101e of the semiconductor substrate 101. In some embodiments, the recess 101e is entirely filled by the isolation member 108. In some embodiments, a depth of the isolation member 108 is substantially greater than or equal to a depth of the active area 101b.

Figure 4:
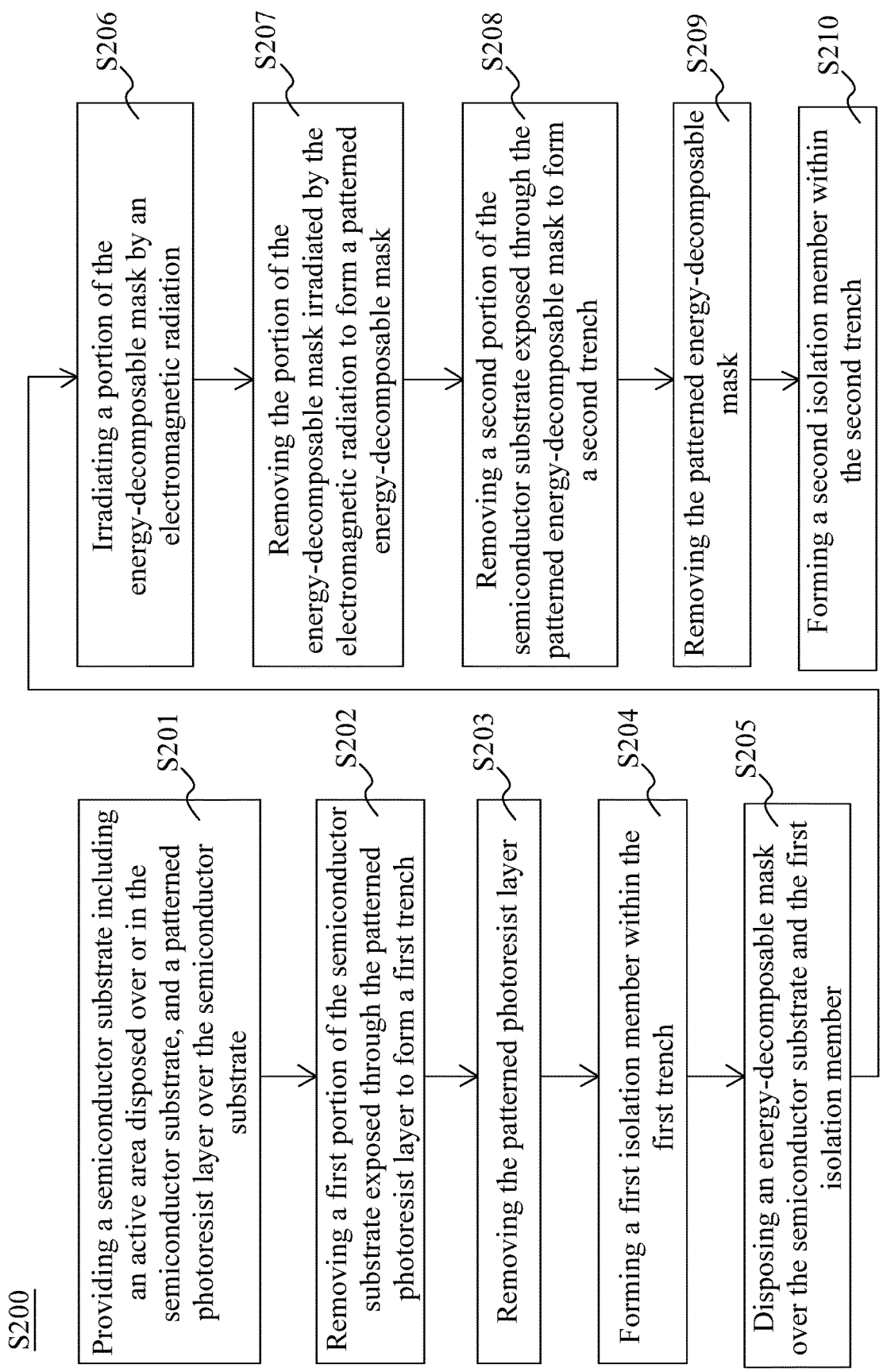
FIG. 4 is a flow diagram illustrating a method of manufacturing a memory device in accordance with some embodiments of the present disclosure.

FIG. 4 is a flow diagram illustrating a method S200 of manufacturing a memory device 100 in accordance with some embodiments of the present disclosure, and FIGS. 5 to 28 are cross-sectional views of intermediate stages in formation of the memory device 100 in accordance with some embodiments of the present disclosure.

The stages shown in FIGS. 5 to 28 are also illustrated schematically in the flow diagram in FIG. 4. In following discussion, the fabrication stages shown in FIGS. 5 to 28 are discussed in reference to process steps shown in FIG. 4. The method S200 includes a number of operations, and description and illustration are not deemed as a limitation to a sequence of the operations. The method S200 includes a number of steps (S201, S202, S203, S204, S205, S206, S207, S208, S209 and S210).

Figure 5:
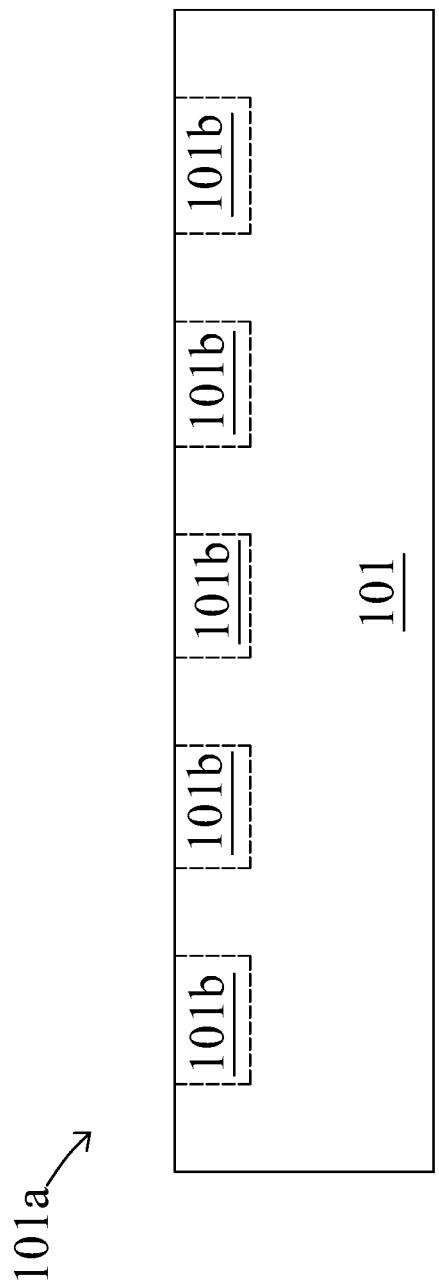
FIGS. 5 to 28 are cross-sectional views of intermediate stages in the formation of a memory device in accordance with some embodiments of the present disclosure.
Figure 6:
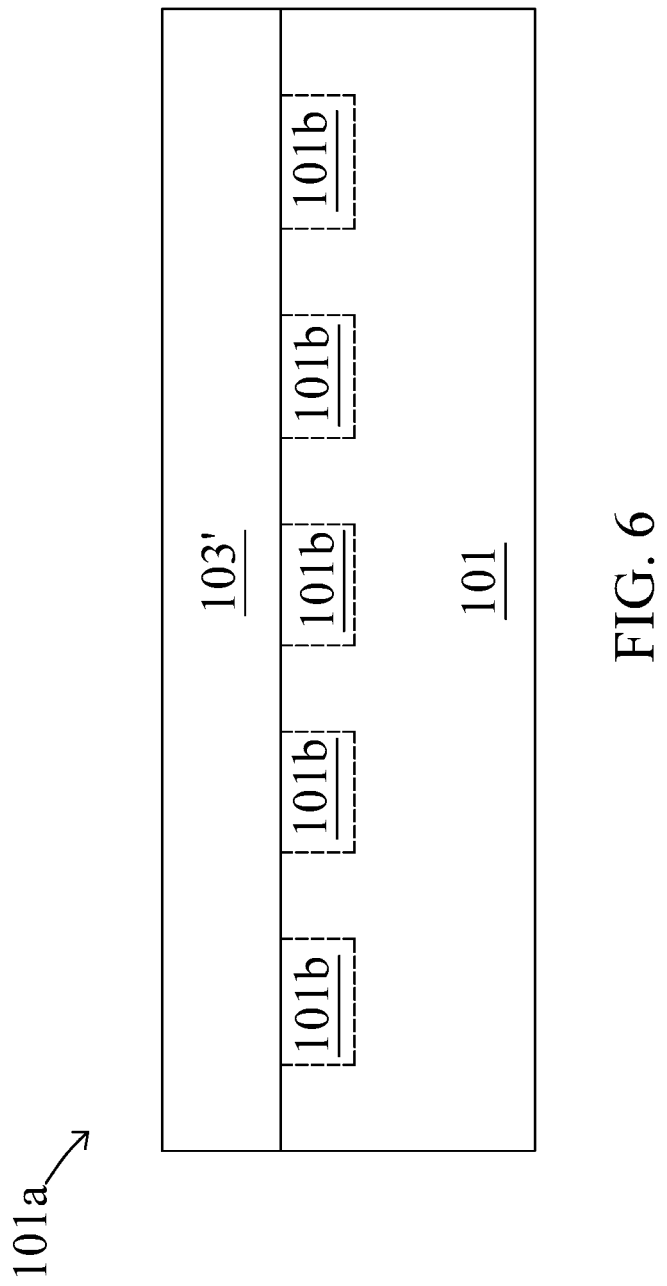
Figure 7:
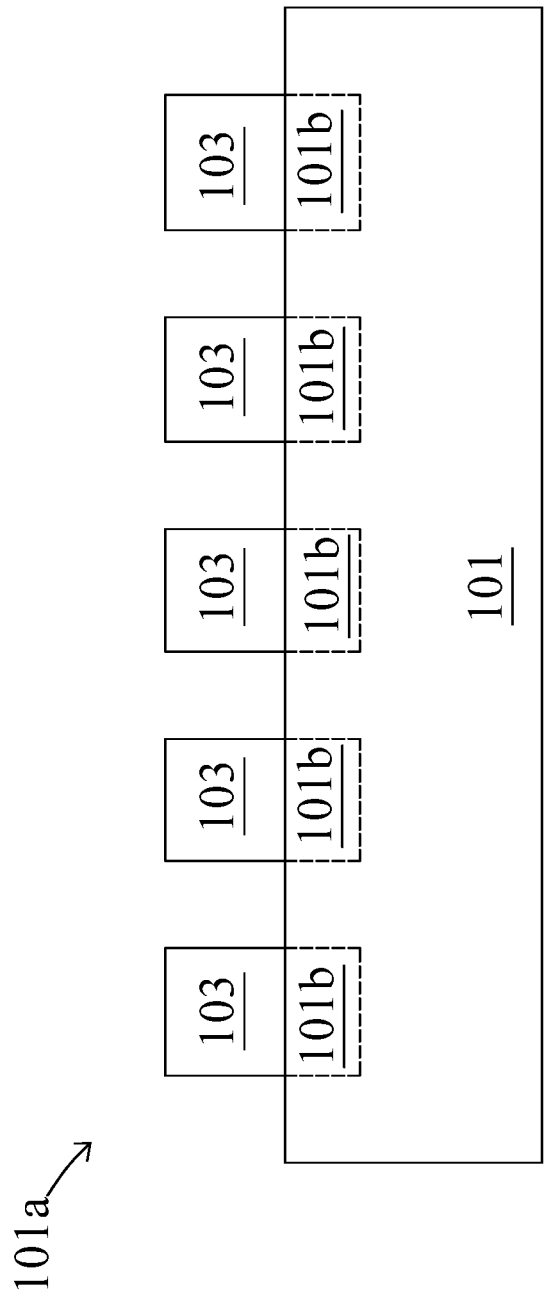

Referring to FIGS. 5 to 7, a semiconductor substrate 101 is provided, wherein the semiconductor substrate 101 includes an active area 101b disposed over or in the semiconductor substrate 101 and a patterned photoresist layer 103 over the semiconductor substrate 101 according to step S201 in FIG. 4.

In some embodiments as shown in FIG. 5, the semiconductor substrate 101 including the active area 101b disposed over or in the semiconductor substrate 101 is provided. In some embodiments, the semiconductor substrate 101 includes semiconductive material. In some embodiments, the semiconductor substrate 101 is a silicon substrate. In some embodiments, the semiconductor substrate 101 is defined with a peripheral region (not shown) and an array region 101a at least partially surrounded by the peripheral region. In some embodiments, the array region 101a is adjacent to a central area of the semiconductor substrate 101.

In some embodiments, the active area 101b is a doped region in the semiconductor substrate 101. In some embodiments, the active area 101b extends horizontally over or under a top surface of the semiconductor substrate 101. In some embodiments, each of the active areas 101b includes a same type of dopant. In some embodiments, each of the active areas 101b includes a type of dopant that is different from types of dopants included in other active areas 101b. In some embodiments, each of the active areas 101b has a same conductive type. In some embodiments, the active area 101b is formed by an ion implantation process or an ion doping process.

In some embodiments as shown in FIGS. 6 and 7, the patterned photoresist layer 103 is formed over the semiconductor substrate 101. In some embodiments, the patterned photoresist layer 103 is formed by disposing a photoresist material 103' over the semiconductor substrate as shown in FIG. 6, and patterning the photoresist material 103' as shown in FIG. 7. The patterning of the photoresist material 103' includes removing portions of the photoresist material 103' by etching or any other suitable process. As shown in FIG. 7, the semiconductor substrate 101 is at least partially exposed through the patterned photoresist layer 103.

Figure 8:
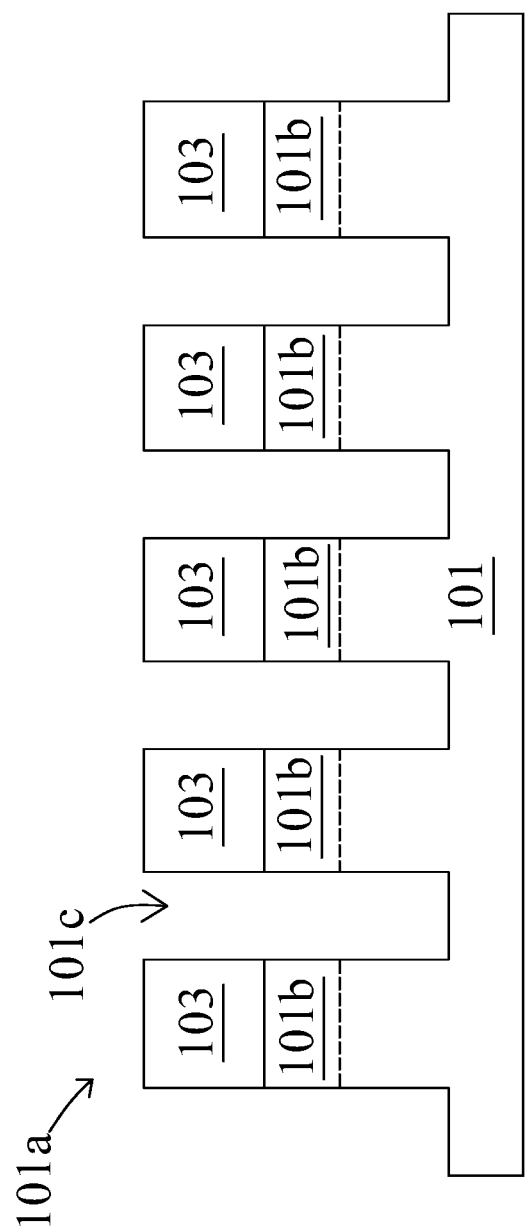

Referring to FIG. 8, a first portion of the semiconductor substrate 101 exposed through the patterned photoresist layer 103 is removed to form a first trench 101c according to step S202 in FIG. 4. The first trench 101c extends partially through the semiconductor substrate 101. In some embodiments, the first portion of the semiconductor substrate 101 exposed through the patterned photoresist layer 103 is removed by etching or any other suitable process.

Figure 9:
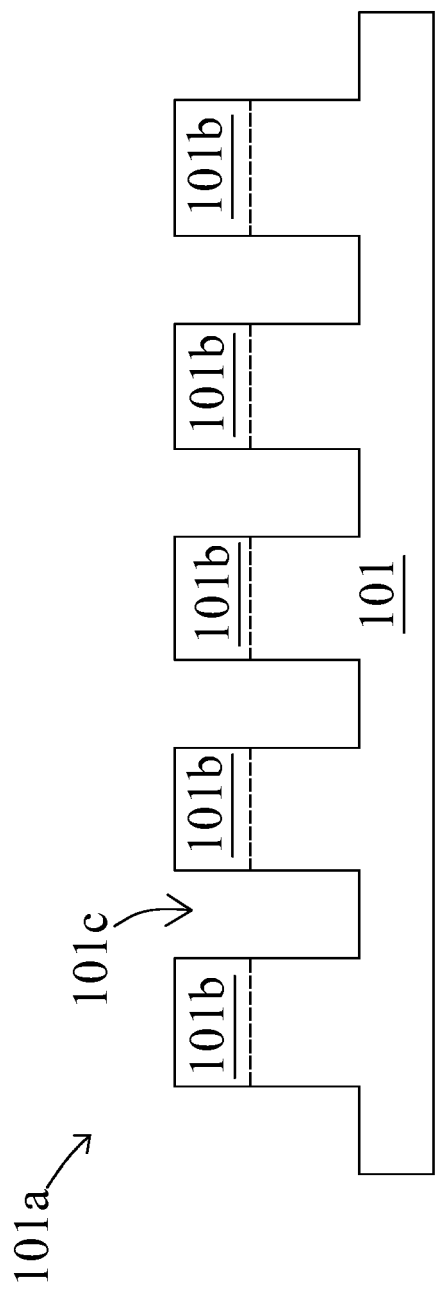
Figure 10:
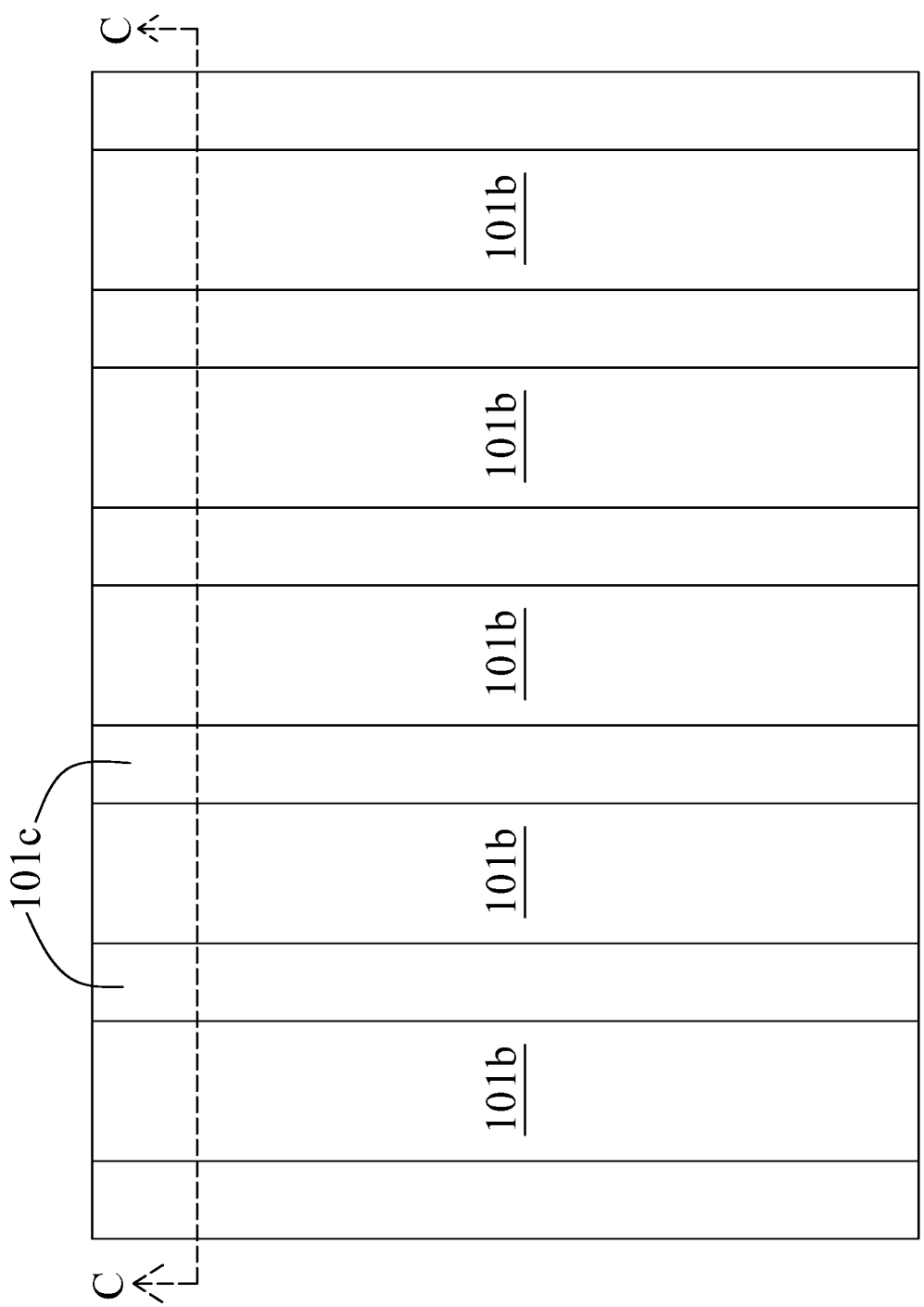

Referring to FIGS. 9 and 10, the patterned photoresist layer 103 is removed according to step S203 in FIG. 4. FIG. 9 is a cross-sectional side view along a line C-C in FIG. 10, and FIG. 10 is a top view of FIG. 9. In some embodiments, the patterned photoresist layer 103 is removed by etching, stripping or any other suitable process. As shown in FIG. 10, the active area 101b of the semiconductor substrate 101 is exposed after the removal of the patterned photoresist layer 103. In some embodiments, a strip pattern as seen in the top view of FIG. 10 is formed after the formation of the first trench 101c as shown in FIGS. 9 and 10.

Figure 11:
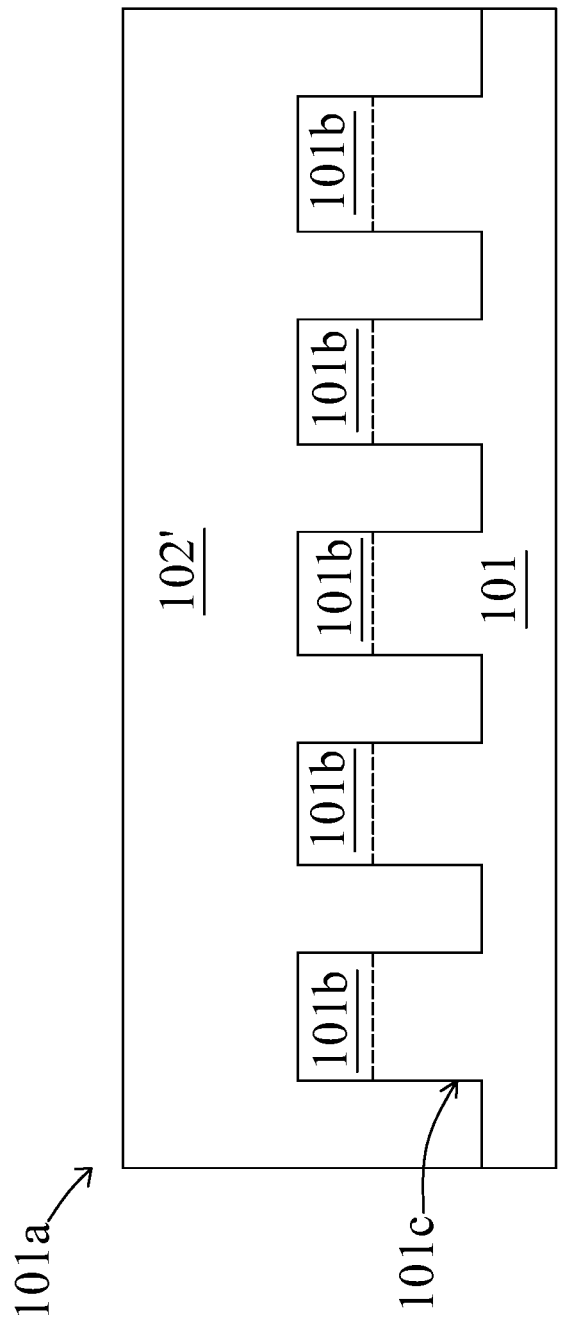
Figure 12:
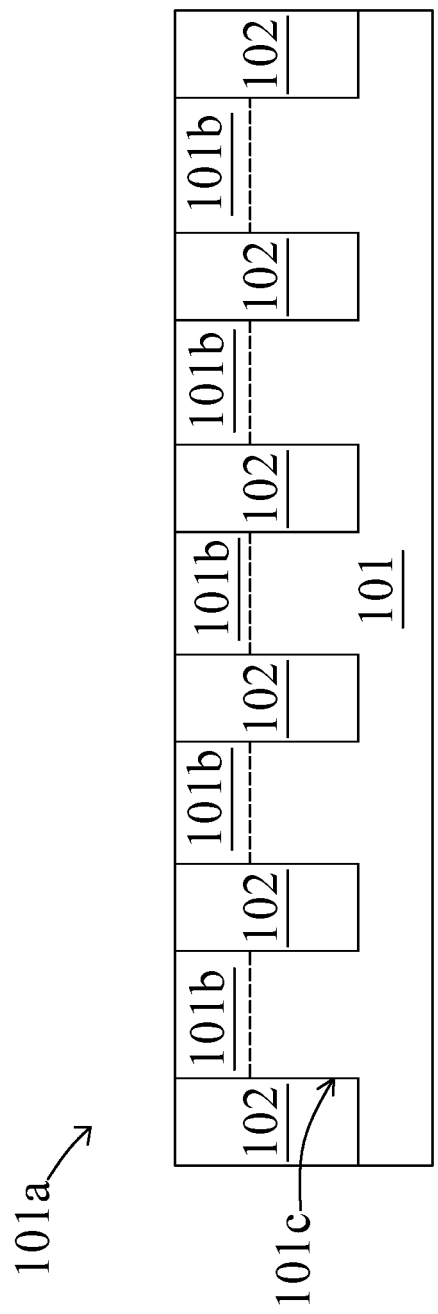
Figure 13:

Referring to FIGS. 11 to 13, a first isolation member 102 is formed within the first trench 101c according to step S204 in FIG. 4. FIG. 13 is a top view of FIG. 12. FIG. 12 is a cross-sectional side view along a line D-D in FIG. 13. In some embodiments, the first isolation member 102 is formed by disposing a first isolation material 102' over the semiconductor substrate 101 and within the first trench 101c, and then removing portions of the first isolation material 102' to form the first isolation member 102 as shown in FIGS. 12 and 13.

In some embodiments, the first trench 101c is filled by the first isolation material 102'. In some embodiments, the portions of the first isolation material 102' are removed by planarization, etching or any other suitable process. In some embodiments, the first isolation member 102 is adjacent to or surrounds the active area 101b of the semiconductor substrate 101. In some embodiments, the first isolation member 102 includes oxide or the like. In some embodiments, the first isolation member 102 is a part of an isolation member 108, which will be discussed later.

Figure 14:
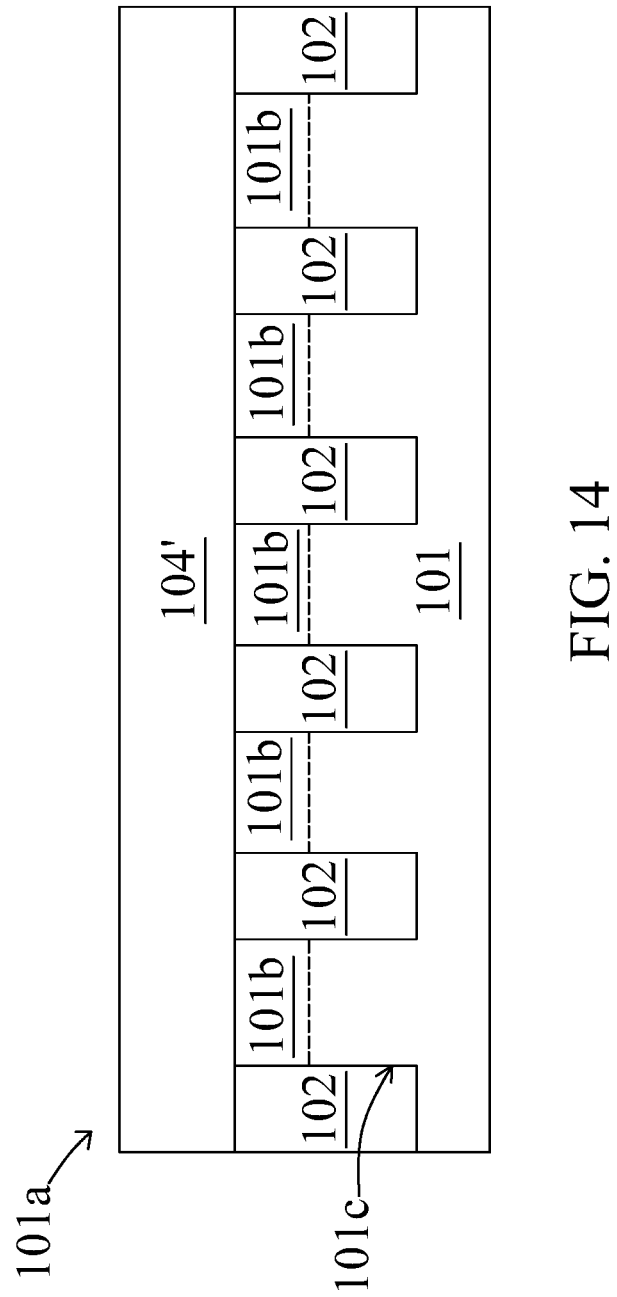
Figure 15:
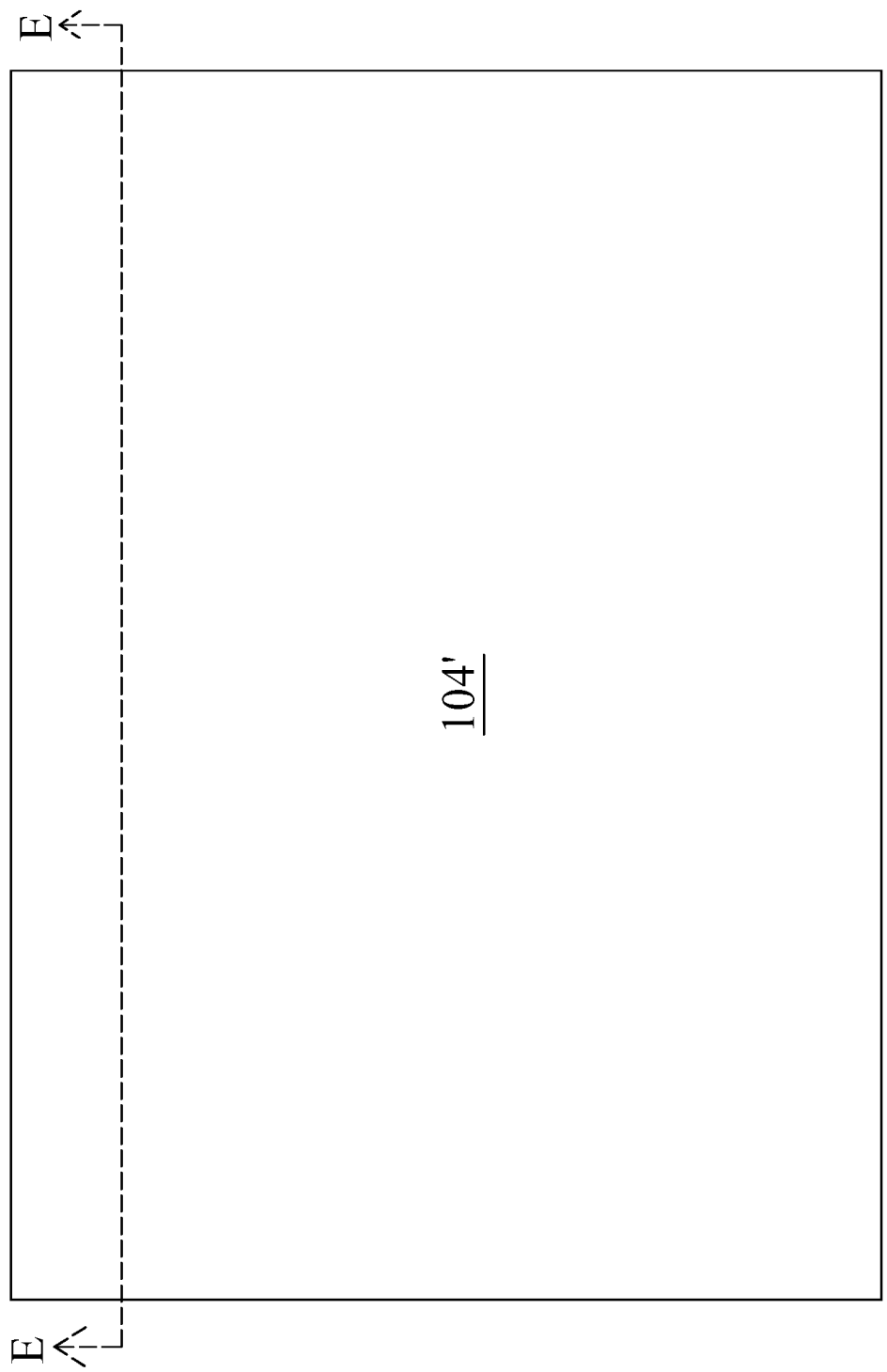

Referring to FIGS. 14 to 15, an energy-decomposable mask 104' is disposed over the semiconductor substrate 101 and the first isolation member 102 according to step S205 in FIG. 4. FIG. 15 is a top view of FIG. 14. FIG. 14 is a cross-sectional side view along a line E-E in FIG. 15. In some embodiments, the first isolation member 102 is covered by the energy-decomposable mask 104'. In some embodiments, the energy-decomposable mask 104' is disposed by deposition, chemical vapor deposition (CVD), physical vapor deposition (PVD), or any other suitable process. In some embodiments, the disposing of the energy-decomposable mask 104' is performed after the formation of the first isolation member 102.

In some embodiments, the energy-decomposable mask 104' is thermally decomposable, photonically decomposable, electron-beam (e-beam) decomposable, or the like. In some embodiments, the energy-decomposable mask 104' can be decomposed by any suitable kind of energy such as heat, infrared (IR), ultraviolet (UV), e-beam or the like. In some embodiments, the energy-decomposable mask 104' includes a cross-linking compound having a functional group or a double bonding. In some embodiments, the energy-decomposable mask 104' includes polymer, polyimide, resin, epoxy or the like. In some embodiments, the photoresist material 103' and the energy-decomposable mask 104' include different materials.

Figure 16:
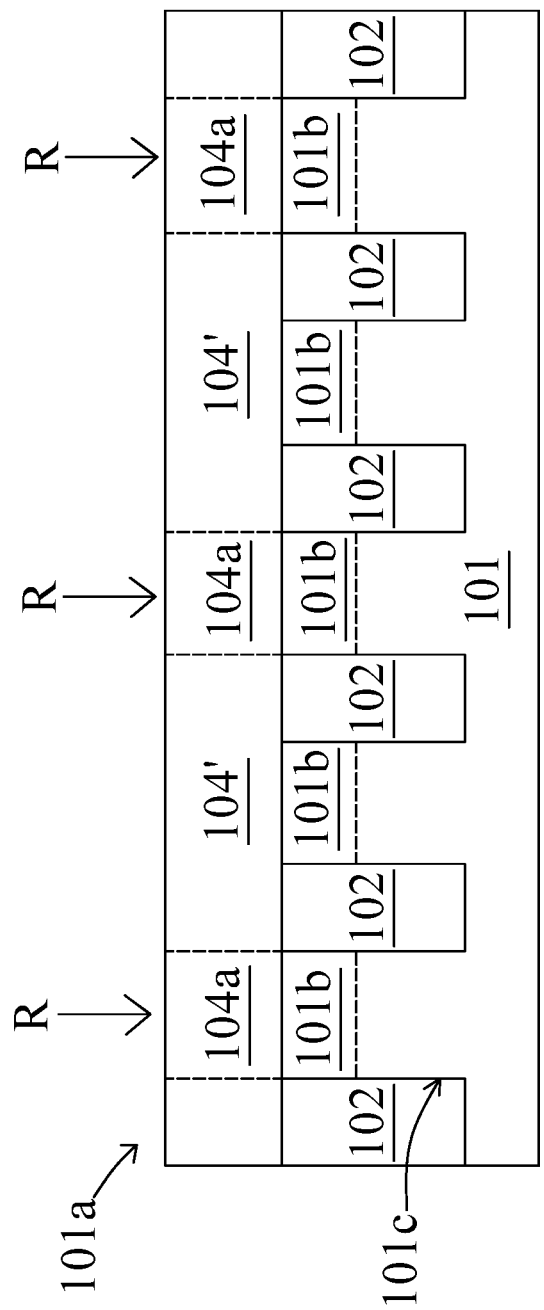
Figure 17:
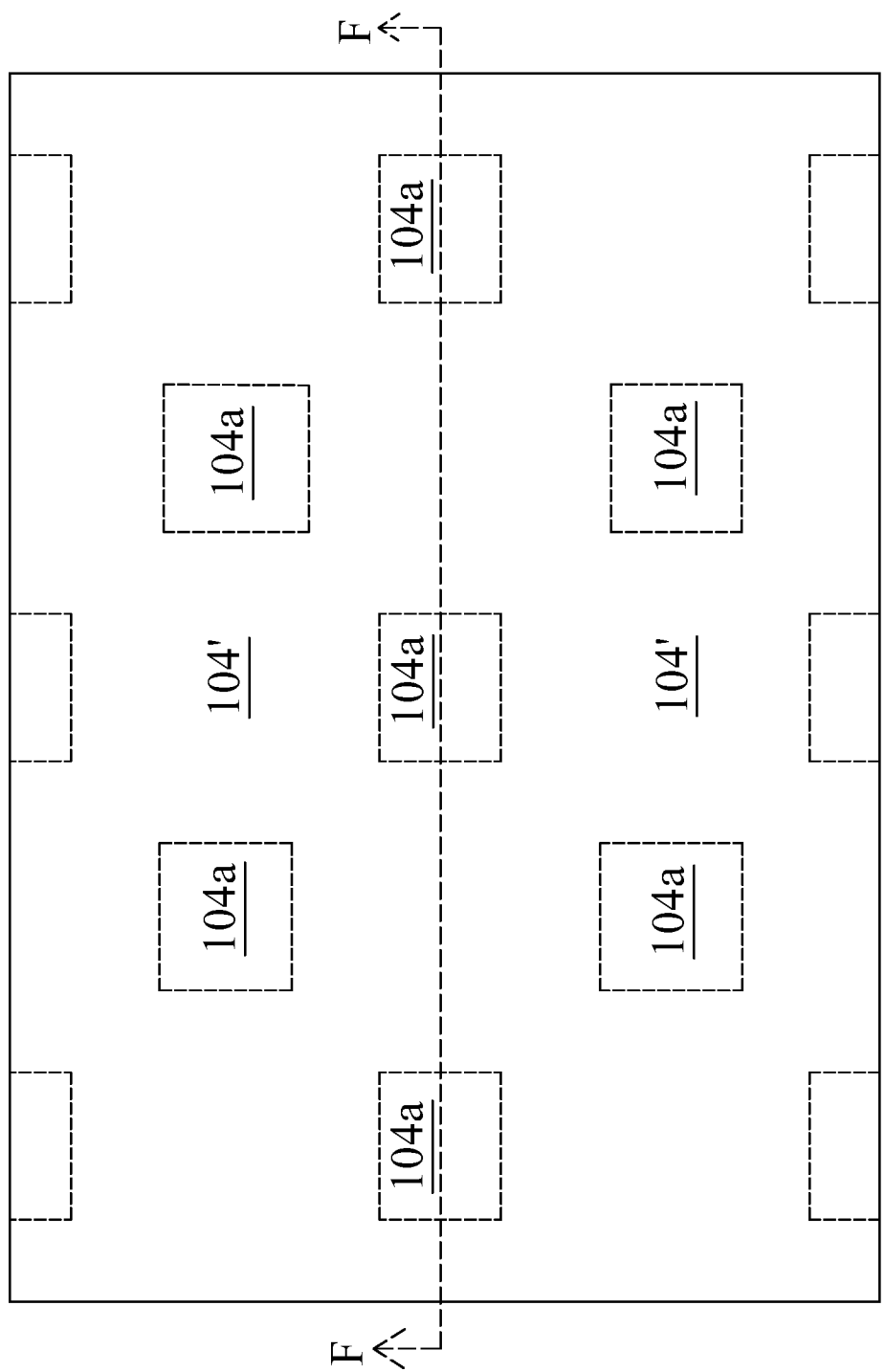

Referring to FIGS. 16 and 17, a portion 104a of the energy-decomposable mask 104' is irradiated with an electromagnetic radiation R according to step S206 in FIG. 4. FIG. 17 is a top view of FIG. 16. FIG. 16 is a cross-sectional side view along a line F-F in FIG. 17. In some embodiments, the portion 104a of the energy-decomposable mask 104' is treated with the electromagnetic radiation R. In some embodiments, the portion 104a of the energy-decomposable mask 104' irradiated with the electromagnetic radiation R is disposed above the semiconductor substrate 101. In some embodiments, the portion 104a of the energy-decomposable mask 104' irradiated with the electromagnetic radiation R is disposed above the active area 101b of the semiconductor substrate 101.

In some embodiments, the electromagnetic radiation R is emitted vertically toward the portion 104a of the energy-decomposable mask 104' to treat the portion 104a of the energy-decomposable mask 104'. As a result, the portion 104a of the energy-decomposable mask 104' becomes easily removable. In some embodiments, the electromagnetic radiation R is infrared (IR), ultraviolet (UV), electron beam (e-beam) or the like. In some embodiments, the portion 104a of the energy-decomposable mask 104' has a top cross section in a rectangular, circular or polygonal shape as shown in FIG. 17.

Figure 18:
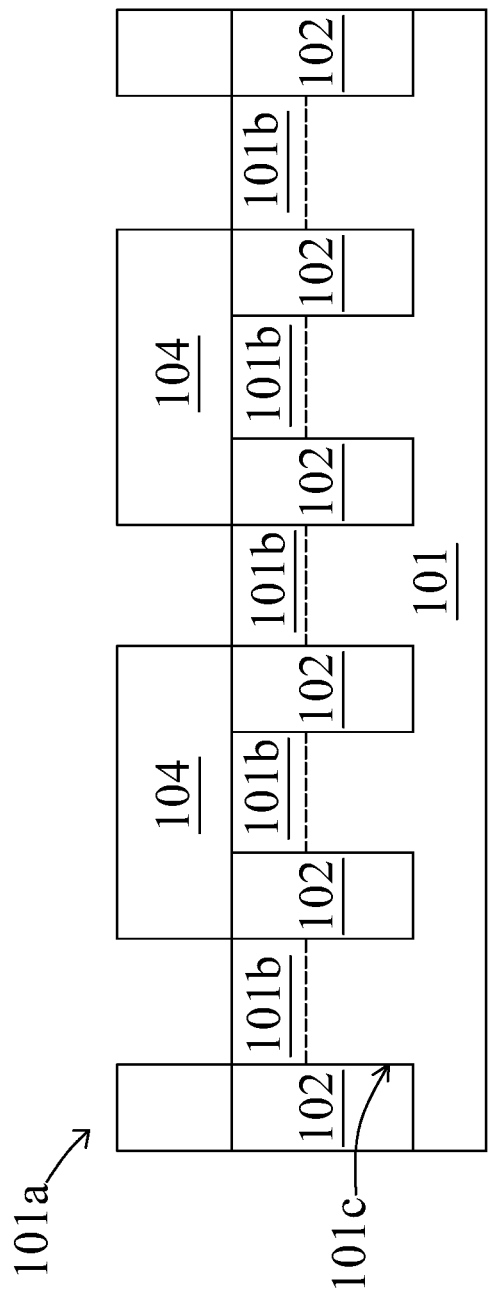
Figure 19:
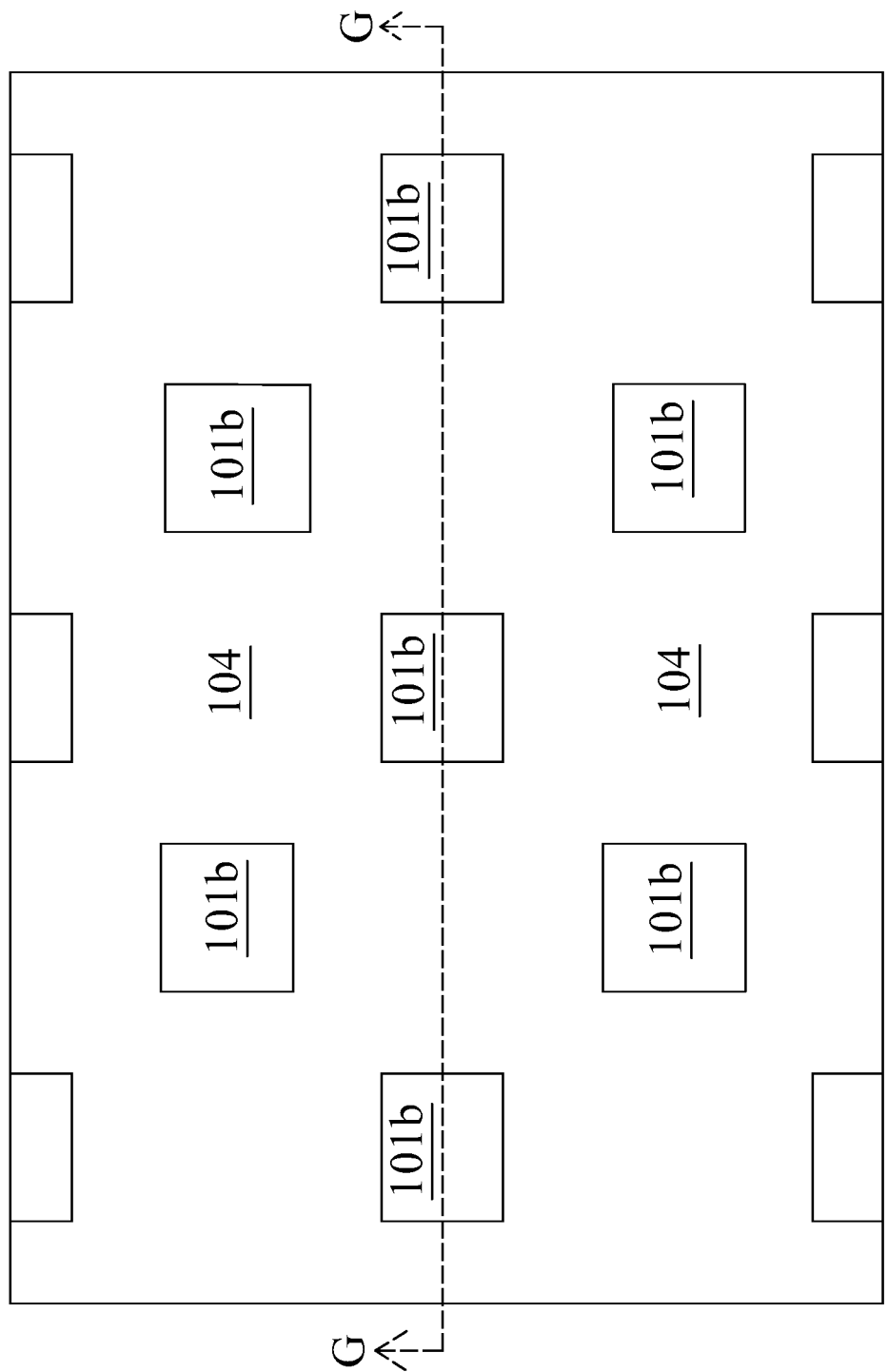

Referring to FIGS. 18 and 19, the portion 104a of the energy-decomposable mask 104' irradiated with the electromagnetic radiation R is removed to form a patterned energy-decomposable mask 104 according to step S207 in FIG. 4. FIG. 19 is a top view of FIG. 18. FIG. 18 is a cross-sectional side view along a line G-G in FIG. 19. In some embodiments, the portion 104a of the energy-decomposable mask 104' is removed by etching or any other suitable process.

After the removal of the portion 104a of the energy-decomposable mask 104', the active area 101b of the semiconductor substrate 101 is exposed through the patterned energy-decomposable mask 104. In some embodiments, the first isolation member 102 is covered by the patterned energy-decomposable mask 104. In some embodiments, the patterned photoresist layer and the patterned energy-decomposable mask 104 include different materials.

Figure 20:
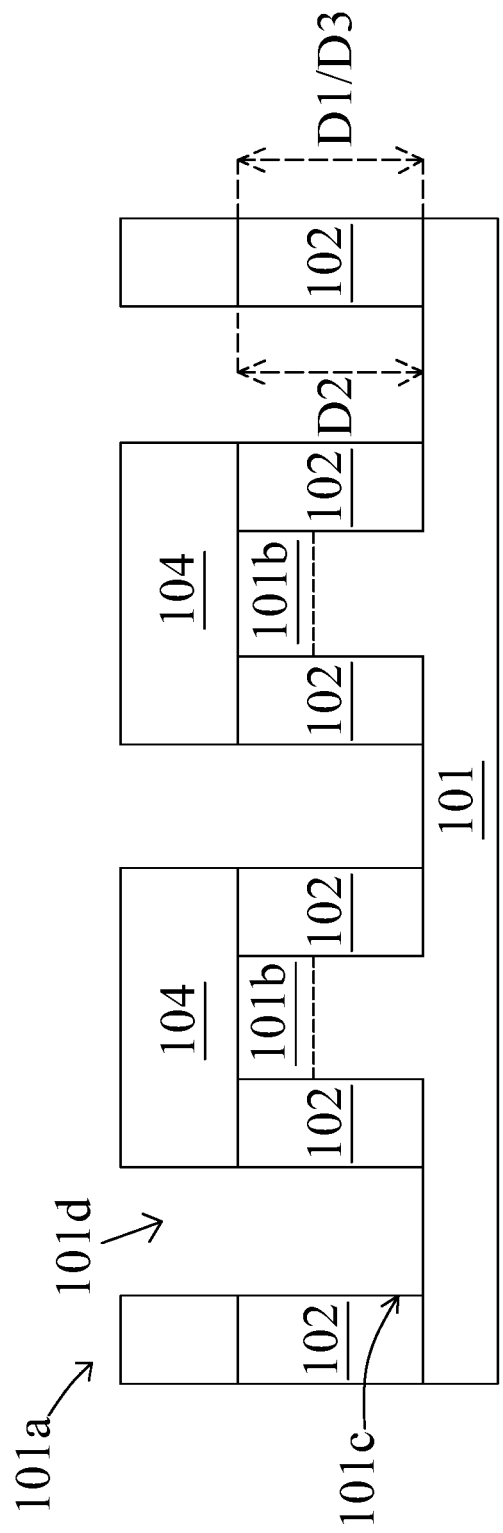
Figure 21:
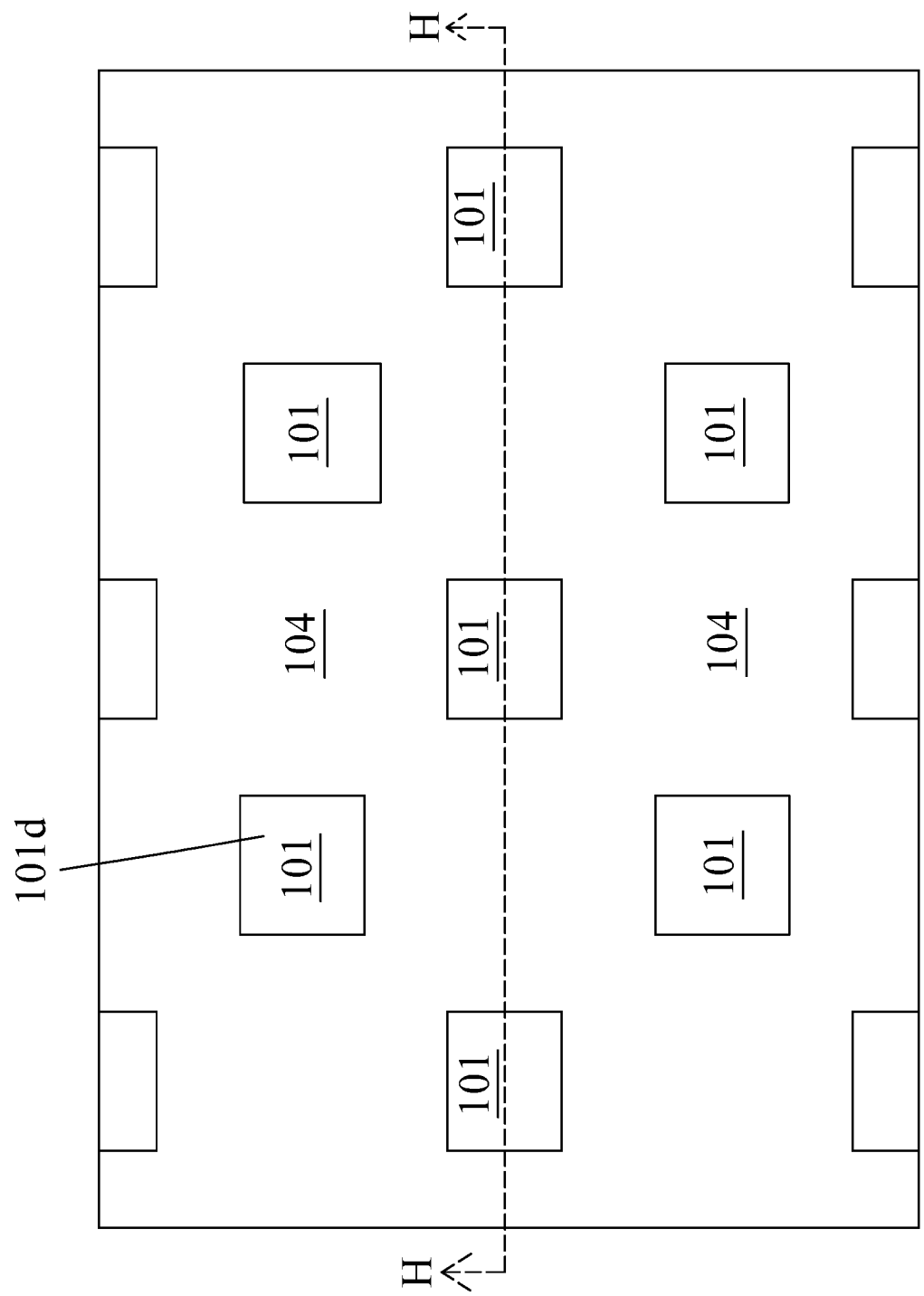

Referring to FIGS. 20 and 21, a second portion of the semiconductor substrate 101 exposed through the patterned energy-decomposable mask 104 is removed to form a second trench 101d according to step S208 in FIG. 4. FIG. 21 is a top view of FIG. 20. FIG. 20 is a cross-sectional side view along a line H-H in FIG. 21. In some embodiments, the second portion of the semiconductor substrate 101 exposed through the patterned energy-decomposable mask 104 is removed by etching or any other suitable process. In some embodiments, the formation of the first trench 101c is performed prior to the formation of the second trench 101d.

In some embodiments, a depth D1 of the first trench 101c is substantially equal to a depth D2 of the second trench 101d. In some embodiments, the depth D1 of the first trench 101c is substantially equal to a depth D3 of the first isolation member 102.

Figure 22:
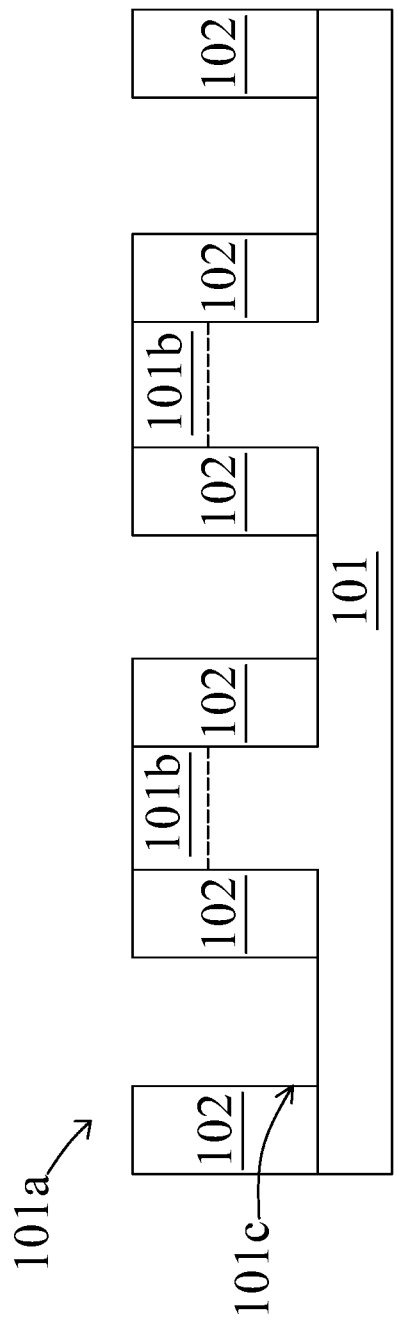

Referring to FIG. 22, the patterned energy-decomposable mask 104 is removed according to step S209 in FIG. 4. In some embodiments, the patterned energy-decomposable mask 104 is removed by etching or any other suitable process. After the removal of the patterned energy-decomposable mask 104, the first isolation member 102 is exposed.

Figure 23:
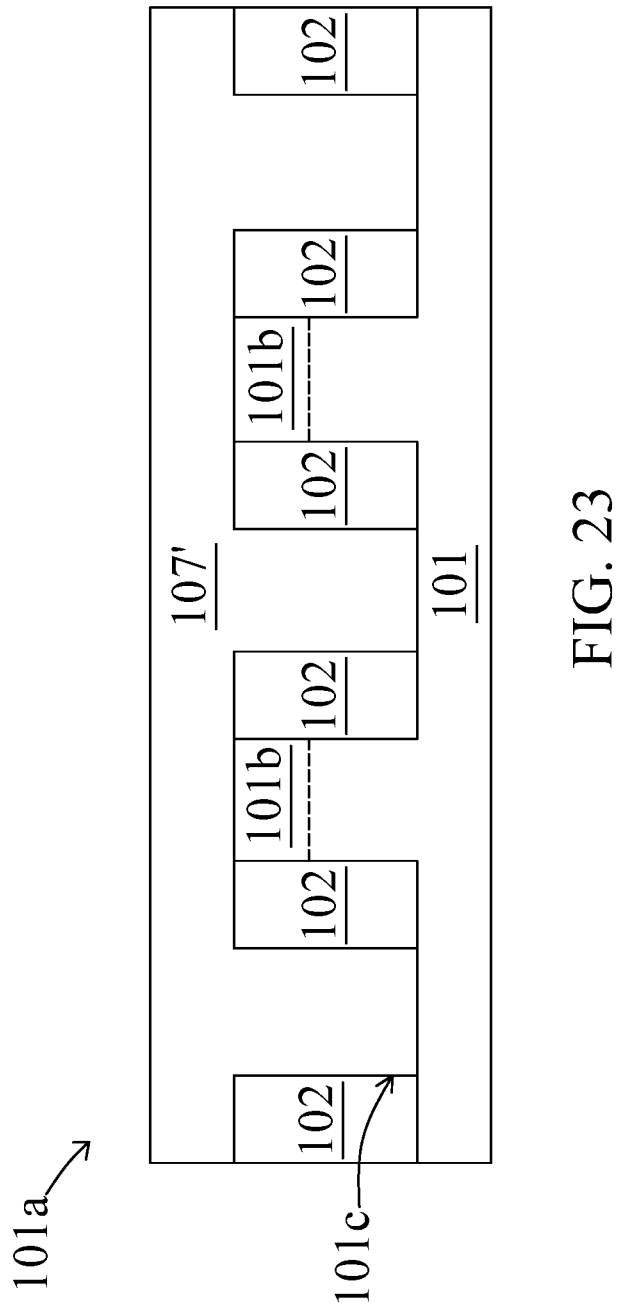
Figure 24:
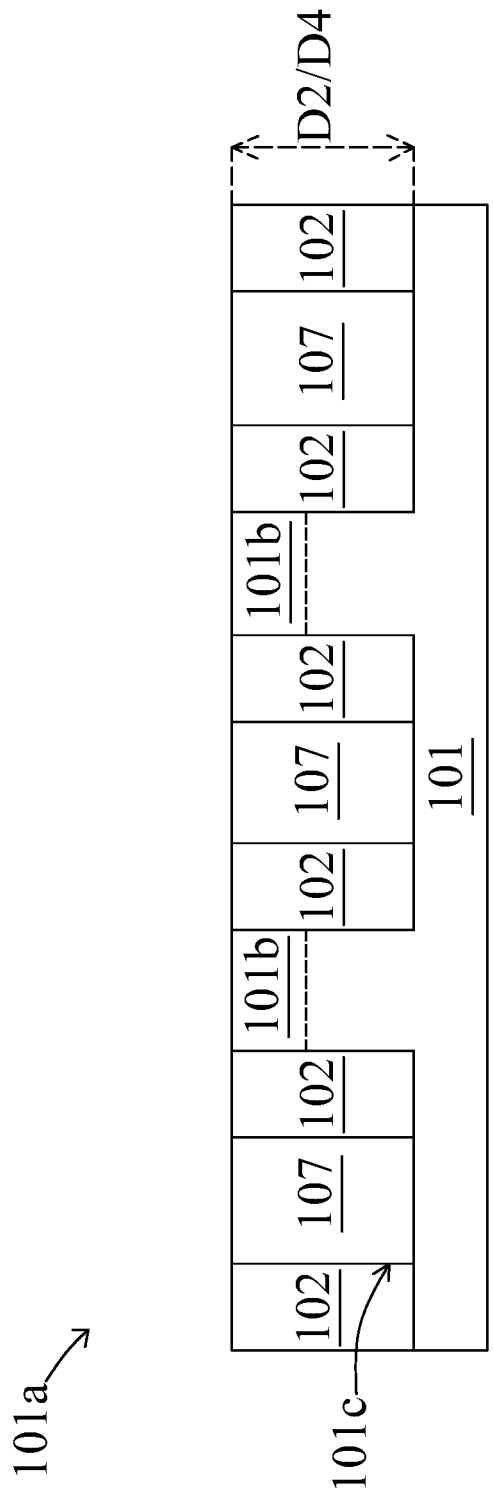
Figure 25:
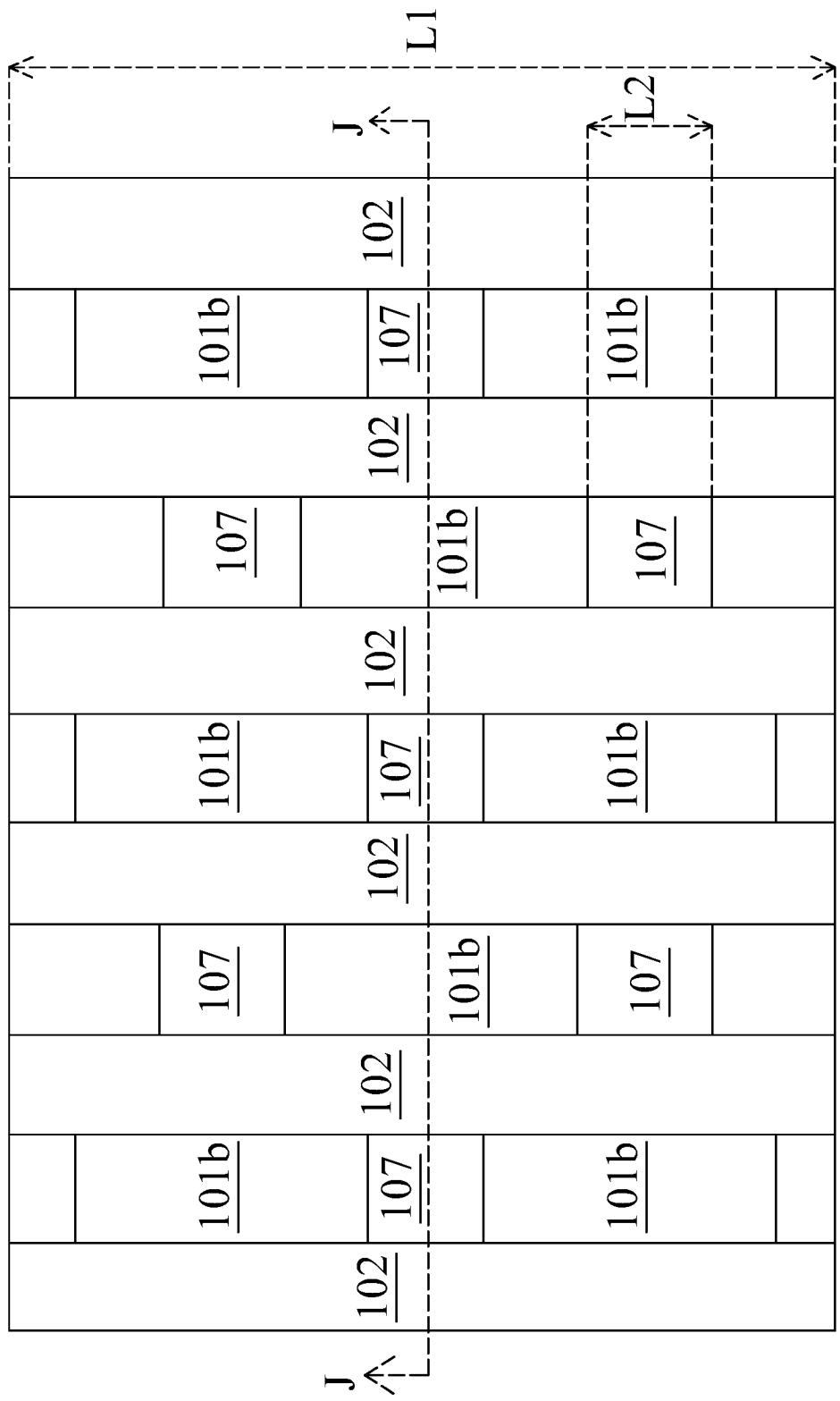

Referring to FIGS. 23 to 25, a second isolation member 107 is formed within the second trench 101d according to step S210 in FIG. 4. FIG. 25 is a top view of FIG. 24. FIG. 24 is a cross-sectional side view along a line J-J in FIG. 25. In some embodiments, the second isolation member 107 is formed by disposing a second isolation material 107' over the semiconductor substrate 101 and the first isolation member 102 and within the second trench 101d as shown in FIG. 23, and then removing portions of the second isolation material 107' to form the second isolation member 107 as shown in FIG. 24.

In some embodiments, the second trench 101d is filled by the second isolation material 107'. In some embodiments, the portions of the second isolation material 107' are removed by planarization, etching or any other suitable process. In some embodiments, the second isolation material 107' above the second trench 101d is removed. In some embodiments, the first isolation member 102 and the second isolation member 107 surround the active area 101b of the semiconductor substrate 101. In some embodiments, the second isolation member 107 includes oxide or the like. In some embodiments, the first isolation member 102 and the second isolation member 107 include a same material.

In some embodiments, a length L1 of the first isolation member 102 is substantially greater than a length L2 of the second isolation member 107. In some embodiments, the depth D3 of the first isolation member 102 (shown in FIG. 20) is substantially equal to a depth D4 of the second isolation member 107.

Figure 26:
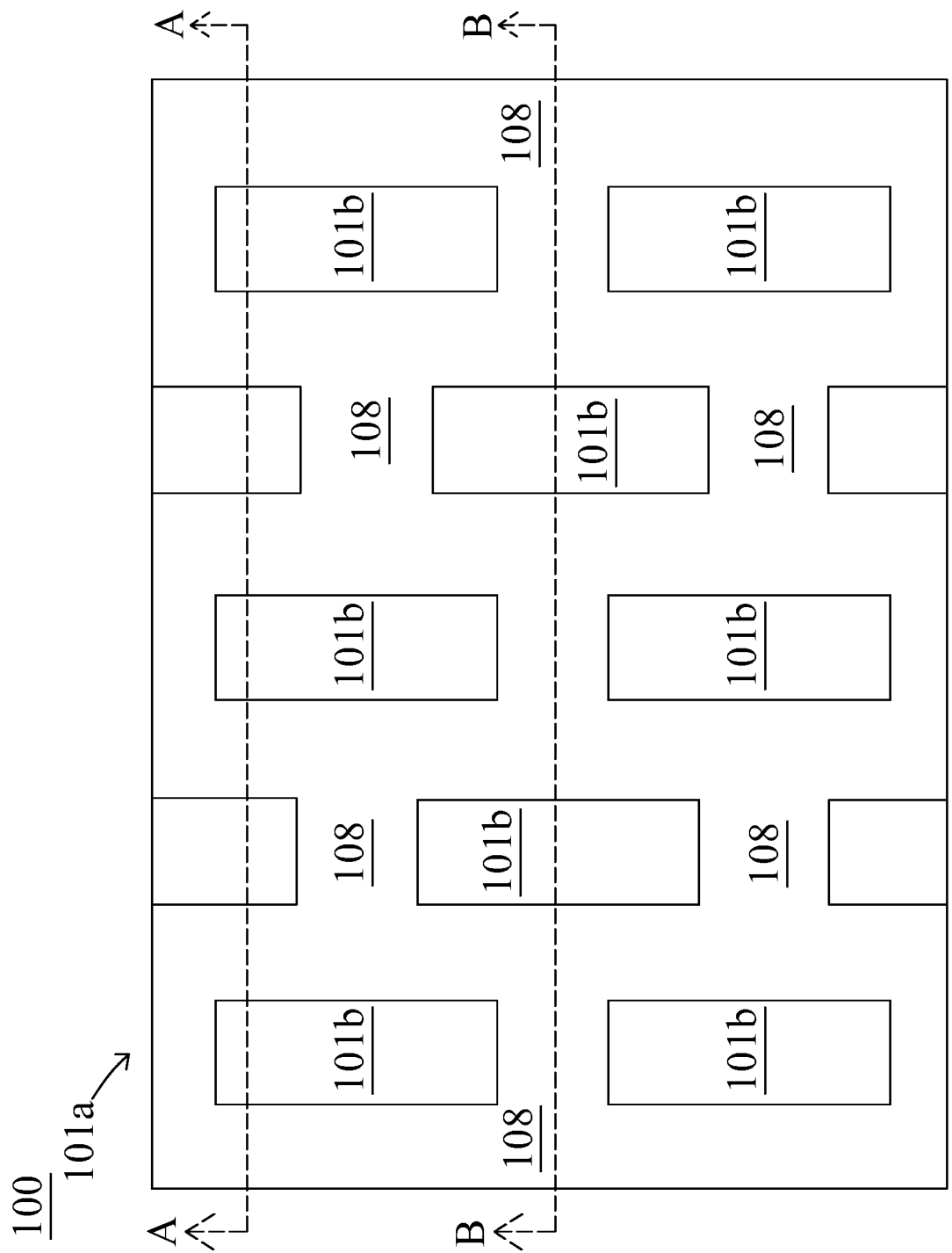
Figure 27:
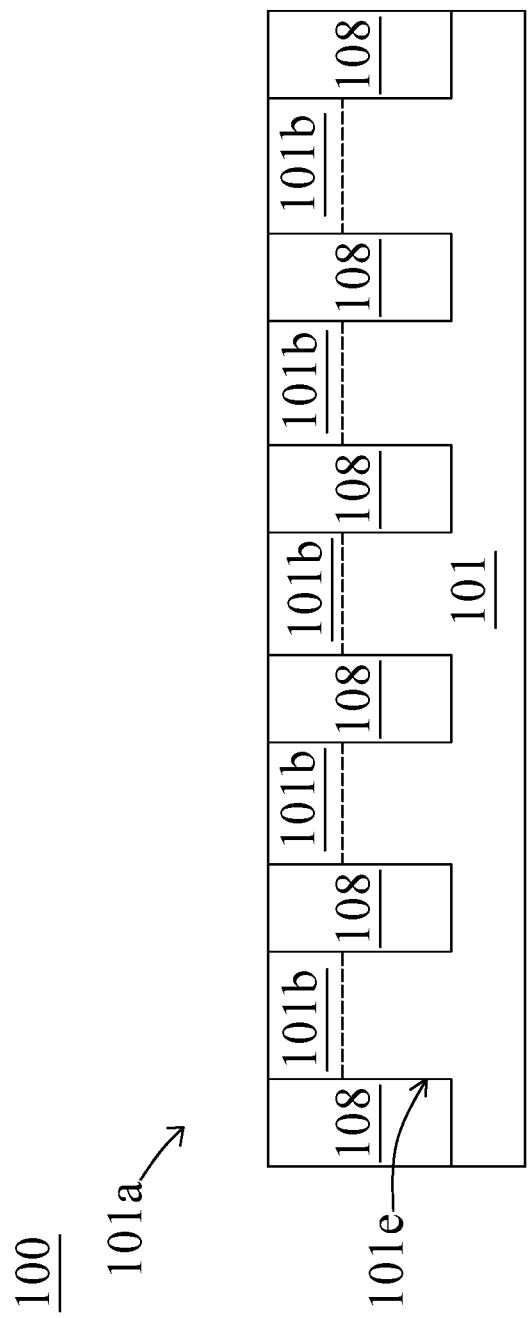
Figure 28:
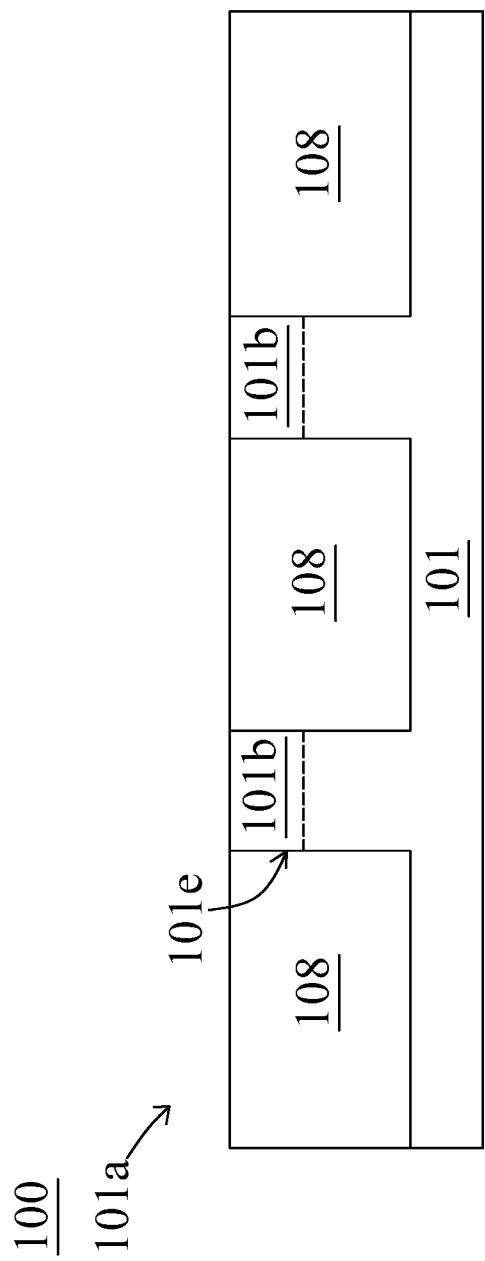

In some embodiments, the first isolation member 102 is integral with the second isolation member 107 to form an isolation member 108. In some embodiments, the isolation member 108 is a shallow trench isolation (STI). In some embodiments, the memory device 100 of FIGS. 1 to 3 is formed as shown in FIGS. 26 to 28. In some embodiments, the active area 101b is surrounded by the isolation member 108, such that the active areas 101b are separated and electrically isolated from each other by the isolation member 108. In some embodiments, the isolation member 108 defines a boundary of the active area 101b. In some embodiments, the isolation member 108 includes oxide or the like.

In some embodiments, a dimension of a top cross section of each active area 101b can be same as or different from those of other active areas 101b. In some embodiments, the active area 101b is in a strip, elongated, rectangular or polygonal shape. Since the active area 101b of the semiconductor substrate 101 is formed by disposing the patterned energy-decomposable mask 104 over the semiconductor substrate 101 and then removing predetermined portions of the semiconductor substrate 101 exposed through the patterned energy-decomposable mask 104, a size of the active area 101b can be maintained with minimal or no decrease during the removal. Therefore, a process window for subsequent processes over the active area 101b is not further reduced.

In an aspect of the present disclosure, a method of manufacturing a memory device is provided. The method includes steps of providing a semiconductor substrate including an active area disposed over or in the semiconductor substrate, and a patterned photoresist layer over the semiconductor substrate; removing a first portion of the semiconductor substrate exposed through the patterned photoresist layer to form a first trench; removing the patterned photoresist layer; forming a first isolation member within the first trench; disposing an energy-decomposable mask over the semiconductor substrate and the first isolation member; irradiating a portion of the energy-decomposable mask with an electromagnetic radiation; removing the portion of the energy-decomposable mask irradiated with the electromagnetic radiation to form a patterned energy-decomposable mask; removing a second portion of the semiconductor substrate exposed through the patterned energy-decomposable mask to form a second trench; removing the patterned energy-decomposable mask; and forming a second isolation member within the second trench.

In another aspect of the present disclosure, a method of manufacturing a memory device is provided. The method includes steps of providing a semiconductor substrate having an active area disposed over or in the semiconductor substrate, and a first isolation member extending into the semiconductor substrate and disposed adjacent to the active area; disposing an energy-decomposable mask over the semiconductor substrate and the first isolation member; irradiating a portion of the energy-decomposable mask with an electromagnetic radiation; removing the portion of the energy-decomposable mask irradiated with the electromagnetic radiation to form a patterned energy-decomposable mask; removing a portion of the semiconductor substrate exposed through the patterned energy-decomposable mask to form a trench; removing the patterned energy-decomposable mask; and forming a second isolation member within the trench.

In another aspect of the present disclosure, a method of manufacturing a memory device is provided. The method includes steps of providing a semiconductor substrate having an active area disposed over or in the semiconductor substrate; disposing an energy-decomposable mask over the semiconductor substrate; treating a portion of the energy-decomposable mask; removing the portion of the energy-decomposable mask to form a patterned energy-decomposable mask; removing a portion of the semiconductor substrate exposed through the patterned energy-decomposable mask to form a trench; removing the patterned energy-decomposable mask; and forming an isolation member within the trench.

In conclusion, because the active area of the semiconductor substrate is defined by disposing a patterned energy-decomposable mask over the semiconductor substrate and then removing predetermined portions of the semiconductor substrate exposed through the patterned energy-decomposable mask, a size of the active area can be maintained with minimal or no decrease during the removal. Therefore, a process window for subsequent processes over the active area is not further reduced. As a result, misalignment or leakage among the memory cells in the memory device can be prevented or minimized, and an overall performance the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a memory device, comprising:
   providing a semiconductor substrate including first and second active areas disposed over or in the semiconductor substrate, and a patterned photoresist layer over the semiconductor substrate to cover each of the first and second active areas;
   removing a first portion of the semiconductor substrate exposed through the patterned photoresist layer to form a first trench, wherein the first and second active areas are separated by the first portion of the semiconductor substrate, such that the first and second active areas are separated by the first trench after the first trench is formed;

removing the patterned photoresist layer;
forming a first isolation member within the first trench, wherein a top surface of the first isolation member is coplanar with top surfaces of the first and second active areas of the semiconductor substrate;
disposing an energy-decomposable mask over the first and second active areas of the semiconductor substrate and the first isolation member;
irradiating a portion of the energy-decomposable mask above the first active area with an electromagnetic radiation;
removing the portion of the energy-decomposable mask irradiated with the electromagnetic radiation to form a patterned energy-decomposable mask and to expose the first active area;
removing a second portion of the semiconductor substrate and the first active area exposed through the patterned energy-decomposable mask to form a second trench;
removing the patterned energy-decomposable mask above the second active area; and
forming a second isolation member within the second trench.

2. The method according to claim 1, wherein the top surfaces of the first and second active area of the semiconductor substrate are coplanar with a top surface of the semiconductor substrate, wherein the patterned photoresist layer is disposed on the top surface of each of the first and second active areas of the semiconductor substrate.

3. The method according to claim 1, wherein the energy-decomposable mask is thermally decomposable, photonically decomposable or electron-beam (e-beam) decomposable.

4. The method according to claim 1, wherein the energy-decomposable mask includes a cross-linking compound having a functional group or a double bonding.

5. The method according to claim 1, wherein the energy-decomposable mask includes polymer, polyimide, resin or epoxy.

6. The method according to claim 1, wherein the electromagnetic radiation is emitted vertically toward the portion of the energy-decomposable mask.

7. The method according to claim 1, wherein the electromagnetic radiation is infrared (IR), ultraviolet (UV) or electron beam (e-beam).

8. The method according to claim 1, wherein the first isolation member and the second isolation member surround the second active area of the semiconductor substrate, such that the first isolation member is sandwiched between the second isolation member and the second active area of the semiconductor substrate.

9. The method according to claim 1, wherein the first isolation member and the second isolation member include a same material.

10. The method according to claim 1, wherein the first isolation member is integral with the second isolation member to form a shallow trench isolation (STI).

11. The method according to claim 1, wherein a depth of the first trench is equal to a depth of the second trench.

12. The method according to claim 1, wherein the first isolation member is formed by disposing a first isolation material over the first and second active areas of the semiconductor substrate and within the first trench and then removing a portion of the first isolation material above the top surfaces of the first and second active areas of the semiconductor substrate, such that the top surface of the first isolation member and the top surface of the second active area of the semiconductor substrate are coplanar with each other.

13. The method according to claim 1, wherein the second isolation member is formed by disposing a second isolation material over the second active area of the semiconductor substrate, the first isolation member, and within the second trench, and then removing a portion of the second isolation material above the top surface of the second active area of the semiconductor substrate, such that the top surface of the first isolation member, a top surface of the second isolation member, and the top surface of the second active area of the semiconductor substrate are coplanar with each other.

14. The method according to claim 1, wherein the patterned photoresist layer and the patterned energy-decomposable mask include different materials.

* * * * *